(12) United States Patent
Clifford

(10) Patent No.: US 6,820,797 B2
(45) Date of Patent: Nov. 23, 2004

(54) SYSTEM AND METHOD FOR SEAL FORMATION

(75) Inventor: George M. Clifford, Los Altos Hills, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/352,287

(22) Filed: Jan. 27, 2003

(65) Prior Publication Data

US 2004/0144835 A1 Jul. 29, 2004

Related U.S. Application Data

(63) Continuation-in-part of application No. 10/306,463, filed on Nov. 27, 2002.

(51) Int. Cl.[7] .................. B23K 35/12; G02F 1/1339
(52) U.S. Cl. .................. 228/246; 228/194; 228/245; 349/153; 349/155
(58) Field of Search ................ 228/245, 193, 228/194, 205, 206, 116, 246; 349/153, 155

(56) References Cited

U.S. PATENT DOCUMENTS

| | | | | |
|---|---|---|---|---|
| 4,159,075 A | * | 6/1979 | Ljung et al. ........... | 228/116 |
| 4,659,899 A | * | 4/1987 | Welkie et al. ......... | 219/121.49 |
| 5,012,479 A | * | 4/1991 | Hug et al. ............. | 372/56 |
| 5,497,727 A | * | 3/1996 | Mayeda et al. ........ | 118/733 |
| 5,508,833 A | * | 4/1996 | Saito et al. ............ | 349/153 |
| 5,781,258 A | * | 7/1998 | Dabral et al. .......... | 349/73 |
| 5,799,860 A | * | 9/1998 | Demaray et al. ...... | 228/194 |
| 6,085,966 A | * | 7/2000 | Shimomuki et al. .. | 228/193 |
| 6,122,033 A | * | 9/2000 | Mathew et al. ........ | 349/155 |
| 6,392,163 B1 | * | 5/2002 | Rinne et al. ........... | 174/261 |
| 6,528,909 B1 | * | 3/2003 | Kan et al. .............. | 310/52 |
| 6,586,831 B2 | * | 7/2003 | Gooch et al. .......... | 257/704 |
| 6,691,911 B2 | * | 2/2004 | Iwai et al. ............. | 228/124.6 |

* cited by examiner

Primary Examiner—L. Edmondson

(57) ABSTRACT

Systems and methods for forming a seal between members of an assembly are disclosed. In one embodiment, a seal is formed between a first member and a second member by establishing within the members a bounded volume and creating within the bounded volume a pressure differential with respect to the ambient pressure outside the bounded volume. The pressure differential results in a uniformly applied clamping force to the members thereby creating a reliable seal. A sealing member (such as solder, epoxy, or other sealant) is positioned between the first and second members and the resulting assembly is mechanically positioned such that heat can then be applied to melt the solder. Concurrently, the pressure differential is created which allows the externally applied mechanical positioning to be relaxed while the members are being sealed together. This system and method can be used to create hermetic seals.

12 Claims, 3 Drawing Sheets

SYSTEM AND METHOD FOR SEAL FORMATION

RELATED APPLICATIONS

The present application is a continuation-in-part of application No. 10/306,463, filed Nov. 27, 2002, entitled "SYSTEM AND METHOD FOR SEAL FORMATION," the disclosure of which is hereby incorporated herein by reference now abandoned.

TECHNICAL FIELD

This application relates in general to bonding one structure to another and more particularly to systems and methods for seal formation between surfaces.

BACKGROUND

Suitable bonding of two flat surfaces using solder and/or another bonding materials can be difficult to achieve when a hermetic seal, as well as close spacing between the structures, is desired. Often, in order for a hermetic seal to form in such a closely-spaced environment, the two flat surfaces must be maintained in a parallel orientation during the bonding (i.e., seal formation) process. For larger parts, this parallel orientation becomes more critical since the spacing difference (from low to high) across the parts is greater for a given angular mismatch.

In addition, the aforementioned two flat surfaces may belong to two parts of a device. In some instances, in order for assembled parts of a device to function properly in their intended application, such parts must be situated parallel to each other across the layer of solder or other adhesive, bonding the parts together.

However, when using existing press-together systems, it is difficult to maintain such parallel orientation as compression force is applied to the two parts during the bonding process. For example, unless carefully designed and constructed, during press operations a platen press system can elastically deform in such a way as to cause misalignment of the initially parallel surfaces. This deformation can cause misalignment of the structures being bonded. Furthermore, the bonding of the two structures by the press system may involve heating, such as for curing epoxy or melting solder. Such heat may cause the press and holding fixtures to expand, often unevenly. The result is an uneven clamping force and partial separation along the bond, leading to poor adhesion and the lack of a hermetic seal.

BRIEF SUMMARY

In accordance with the present invention, systems and methods for hermetic seal formation between at least two members in a closely-spaced environment are taught. In accordance with the invention, parallel orientation of the two members to be bonded is achieved by an induced pressure-difference between the environment outside of the members being bonded and that of the environment within the assembly containing those members. The pressure differential induces evenly-distributed compression force, thereby facilitating substantially uniform, and thus parallel, spacing between the two members.

In accordance with the present invention, a seal formulation assembly process begins with an adhesive structure (such as, for example, solder, epoxy, or another sealant) being positioned between a first member and a second member. After the members are positioned with respect to each other, they are brought together mechanically. If necessary, heat can be applied at this time. A reduction of internal pressure relative to the outside or ambient pressure is then induced within the assembly creating the necessary pressure difference for joining the two members.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
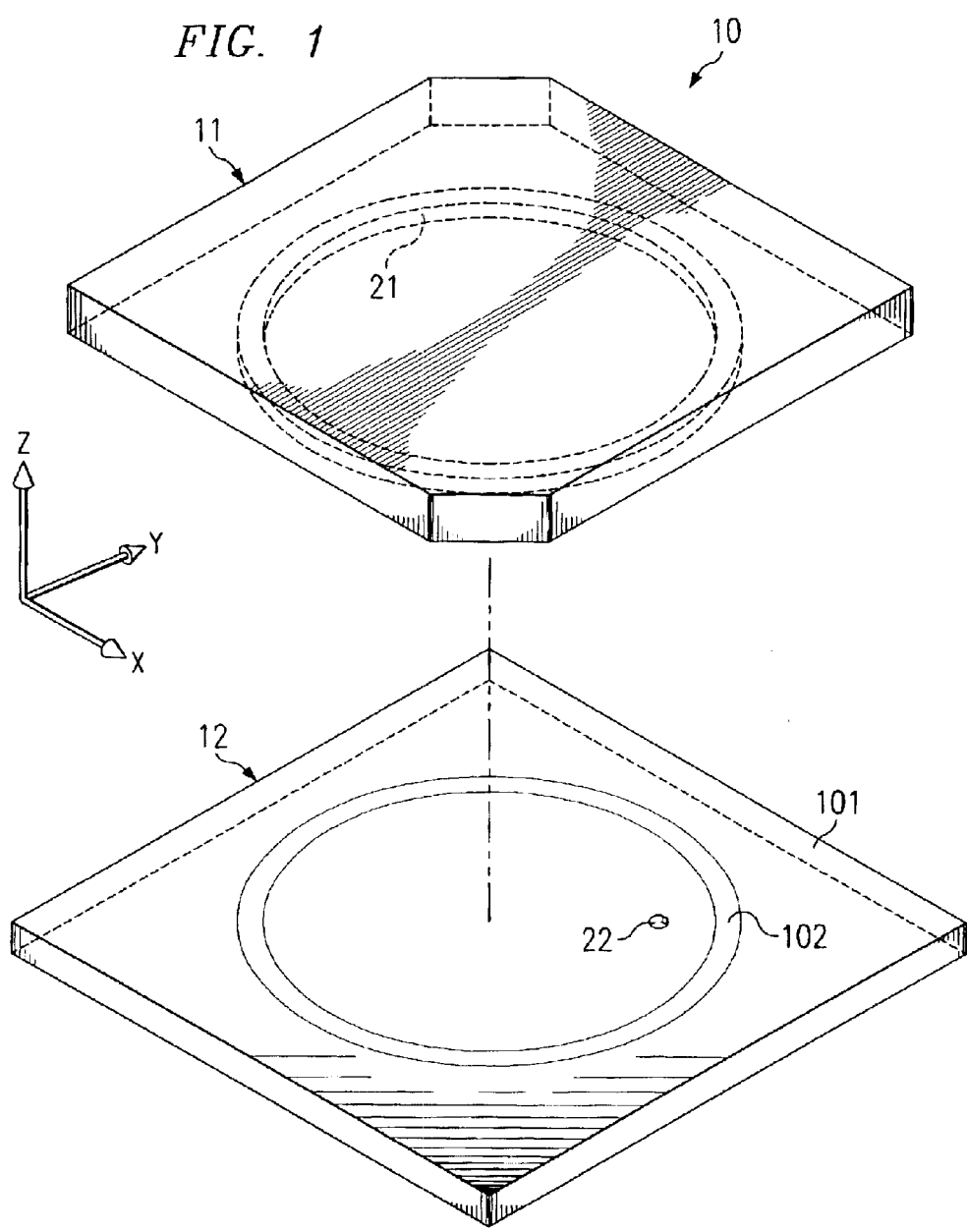
FIG. 1 shows one embodiment in accordance with the invention of a two-part structure being sealed together using a solder-bond.
Figure 2:
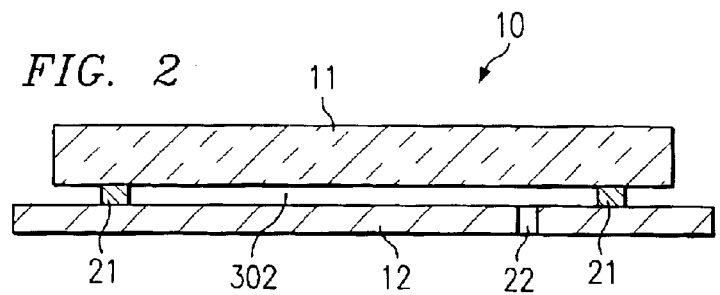
FIG. 2 shows a cross-section schematic view of the structure of FIG. 1 from the side.

An embodiment in accordance with the invention where a solder-bond is used to seal a quartz waveguide structure to a silicon chip at a spacing of 5 microns is shown in FIGS. 1 and 2. Solder 21 is located in a circular ring just inside the periphery of quartz top part 11 and silicon bottom part 12. During the sealing process, the desire is to create a hermetic seal between the top and bottom parts.

For the assembled parts, in the embodiment shown, to function properly in their intended application, they must be parallel to within ±1 microns across the 17 mm diameter solder ring. In addition, the parallelism must be maintained during the soldering process in order to achieve a good bond and seal. For larger parts, parallelism becomes more critical since the spacing difference (from low to high) across the part is greater for a given angular mismatch. In specific testing, the concepts taught herein achieved an acceptable seal for a device having a 5 mm diameter tin/lead solder ring as well as a device having a 17 mm diameter ring of indium/tin solder.

In most bonding presses, it is difficult to maintain the necessary parallelism as the clamping force is applied. Unless it is carefully designed and constructed, a bonding press can elastically deform as the clamping force is applied in such a way as to cause misalignment of the initially parallel platens. Bonding may also involve heating for curing epoxy or melting solder, causing the press and holding fixtures to expand, often unevenly. This results in a non-uniform clamping force and possible part separation along the bond, leading to poor adhesion and a non-continuous bond.

One method of maintaining parallelism is to measure the spacing at several different points and make corrections to the parallelism of the parts while they are clamped. If the parts are being heated, these measurements and corrections must be continuously made during the process. However, for spacing below 10 microns, most equipment is incapable of making this measurement. Another approach is to use a press with enough compliance so that the holding fixture for one or both of the parts will passively self-adjust to being parallel as they are pressed together. This can be impractical if control and adjustment of the X-Y (in-plane) position of the two parts relative to each other is also desired during bonding. In this application, the parts must be positioned in the X-Y plane parallel to within 2 microns.

Assemblies with hermetic seals can be made by taking advantage of surrounding ambient pressure to generate the force to clamp the parts of the assembly together. This is accomplished by creating a reduced internal air pressure within solder ring cavity 302 (FIG. 2) after the parts have initially been mated together. As will be described hereinafter, an opening in one (or both) of the parts provides a path to partially evacuate the area inside the sealant ring. Vent hole (or holes) 22 shown in FIG. 2, serve this purpose. The vent hole(s) could, if desired, serve a purpose in the function of the finished product. The vent hole(s) could also be closed to contain the reduced internal air pressure, or to position a desired gas, liquid, or other substance inside cavity 302 of the finished product.

Figure 3A:
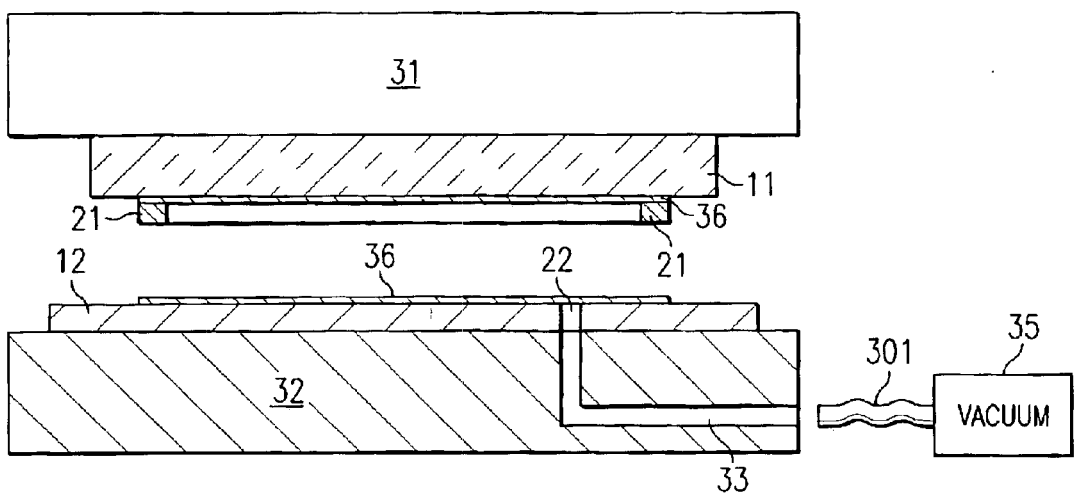
FIGS. 3A–3D show the assembly process for the embodiment in accordance with the invention of FIGS. 1 and 2.

FIGS. 3A–3D show the assembly process for the embodiment of FIGS. 1 and 2. In FIG. 3A, members 11 (quartz) and 12 (silicon) are shown with solder ring 21 and solder pad 36 therebetween. The solder ring (or other adhesive/sealant) could be affixed to one or the other of the parts or could be positioned separate therefrom, perhaps as a preformed part. For assembly, the two parts are held in upper 31 and lower 32 holding fixtures of a mechanical assembly device in a well-known manner, such as to allow for the mechanical mating of the top and bottom parts, while providing only the minimum necessary external force on the parts as they are mated. These fixtures can be equipped with temperature-controlled heaters to melt the solder or cure the epoxy. During the heating process, if desired, the two parts can be correctly X-Y positioned with respect to each other using a vision system or some other alignment method. X-Y positioning must be done in such a way that no component of the X-Y correction force is applied in the Z-direction, which would affect the spacing between the two parts. A vision system can position the two parts with respect to each other by moving them until special fiducial or alignment marks, imprinted on each part, are moved into a pre-defined alignment. Although this alignment process can be done manually, a vision system often consists of a video camera and servo-controlled movers connected to a computer. Software in the computer captures an image of the fiducial marks from the camera and sends commands to the mechanical movers holding one or both of the two parts to adjust the relative positions of the fiducial marks to within a pre-defined tolerance. Parts 11 and 12 can be adjusted to be parallel to each other by making rotational adjustments above the X and Y axes to one or both of the holding fixtures.

However, in practice, this parallelism is difficult to hold during heating and cooling because of thermal expansion and contraction.

Figure 3B:
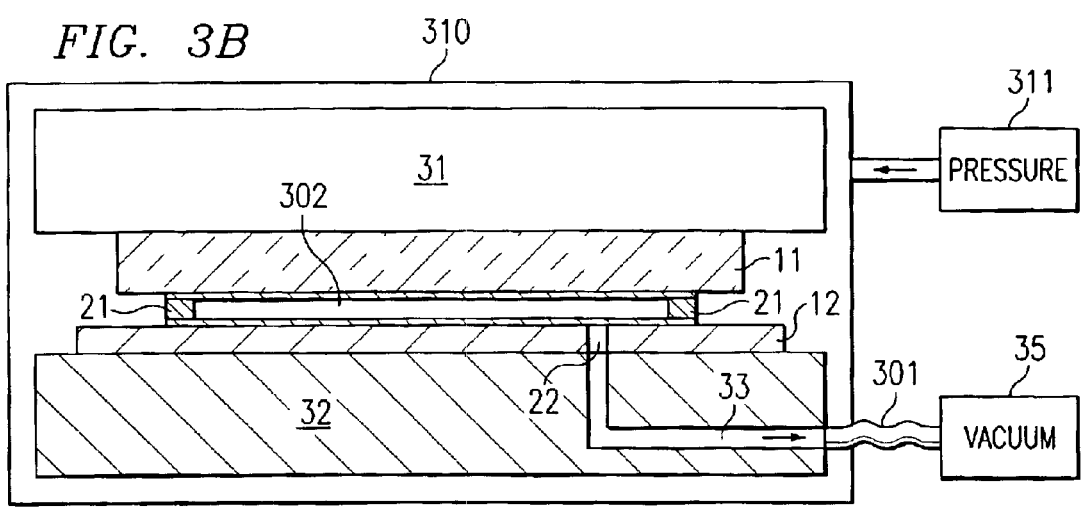

FIG. 3B shows holding fixtures 31, 32 applying mechanical force on parts 11, 12 bringing them into mating relationship with each other, separated by solder or adhesive 21. The amount of this force is such as to position the two members together. A pressure differential is created between the ambient air surrounding members 11, 12, and the region 302 by vacuum pumping device 35, tube 301, tunnel 33 through lower holding fixture 32 and through one or more openings 22 in member 12. Pumping device 35 serves to remove some of the air from the cavity, thereby reducing the atmospheric pressure within the cavity. If desired, the heating process is used to melt solder ring 21.

At this point, the initial mating force may not be uniformly distributed across the two parts because of uneven force from the holding fixtures.

Figure 3C:
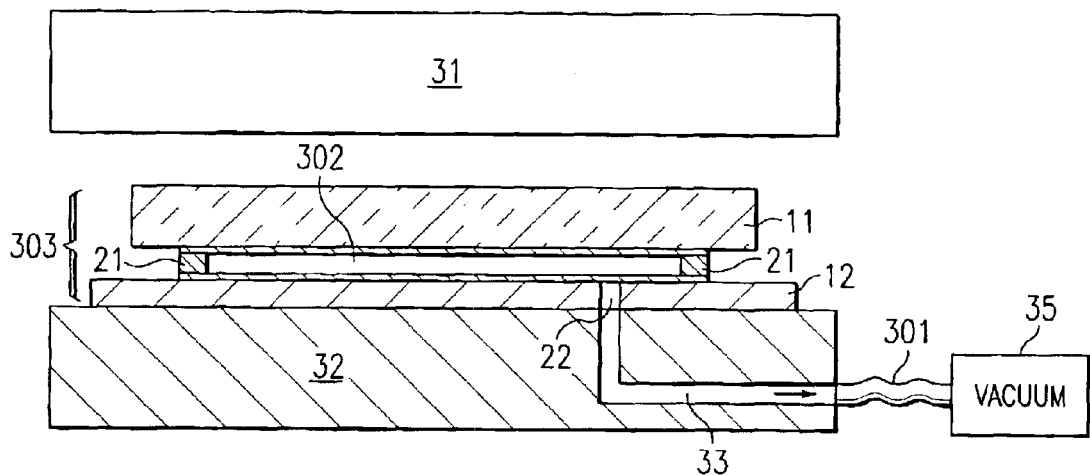
Figure 3D:
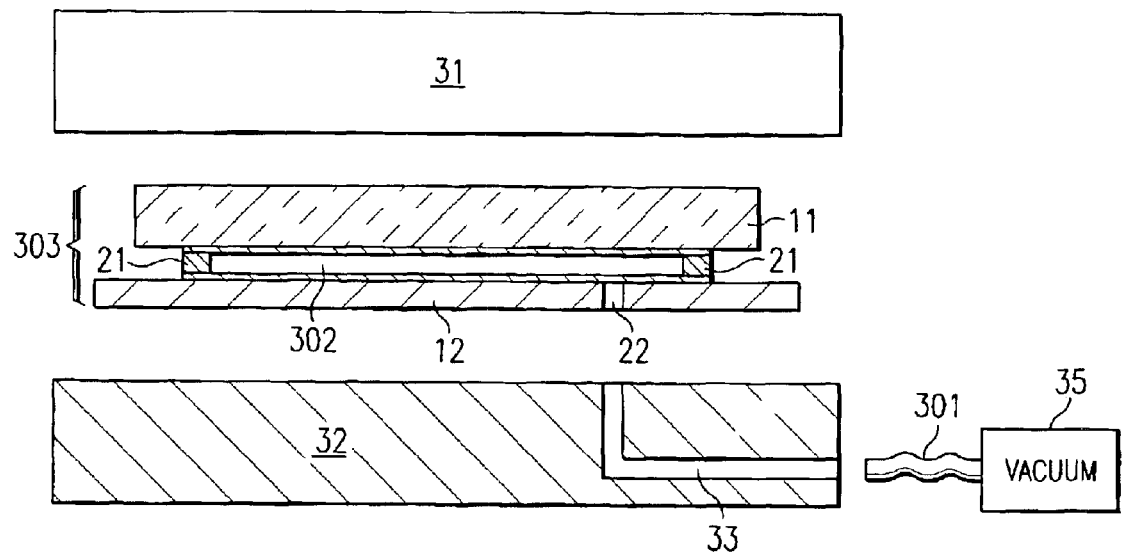

FIG. 3C shows that upper holding fixture 31 has been moved away from part 11 thereby removing the mechanical positioning force from the outsides of parts 11 and 12. However, the force created on members 11 and 12 due to the reduced inner pressure, which is being maintained by vacuum pumping device 35, causes members 11 and 12 to form device 303 having members 11 and 12 bonded to each other by a continuous ring of adhesive or sealant, as shown in FIG. 3D. Bonded assembly 303 is then removed from the assembly fixture. If desired, prior to removing assembly 303, hole(s) 22 can be closed, for example, by melting solder within hole 22, or by other means. This process is useful for creating hermetic seals.

The theoretical clamping force induced by the pressure differential is approximately the product of the area inside the solder ring, times the inside-to-outside pressure difference. This clamping force is in equilibrium with the opposing force exerted by the circular bead of solder (or other sealant) squeezed between the two parts. For an assembly having a solder ring with an 18 mm inside diameter, the clamping force due to the reduced pressure would be approximately 23.7 newtons, where the pressure differential between atmospheric pressure and the pressure inside is assumed to be approximately 93 kPa. In one observation, the "pressure differential" (lower pressure zone) was nominally 81 kPa to 88 kPa, but could be controlled as desired. If the ambient pressure were to be atmospheric (101 kPa), then the absolute pressure (reduced pressure) would be, in one embodiment, in the range of 13 kPa to 20 kPa.

The relative X-Y (in-plane) positions of the two parts can be adjusted, if desired, while the solder is melted and the external clamping force is removed as shown in FIG. 3C. At this point the parts are held together by the air pressure difference created by the reduced inner pressure. While lower part 12 continues to be held firmly in place, upper part 11 is essentially released and is held in place only by its sides (not shown). This allows the upper part the freedom to self-adjust its vertical, pitch, and roll position and become parallel with the mating lower part, while still allowing for X-Y adjustments between the two parts. Such X-Y adjusting could, if desired, be accomplished mechanically.

For proper operation, the solder properties should be consistent around ring 21, and solder pads 102 (FIG. 1) should have a uniform width and be symmetrically designed. There is a solder pad (not shown) between solder ring 21 and upper part 11. Also the upper and lower parts could be reversed, so that the solder is initially on bottom part 12. This insures that the force between the parts is uniformly distributed around the solder ring. Other solder pad geometries may be possible to insure uniformity of spacing. In some special cases, it may be desirable to have two mating parts positioned to be non-parallel. This might be accomplished by creating asymmetric pad geometries. During the clamping process, the quartz and silicon parts can be held in their respective fixtures by a vacuum or mechanical means, neither of which are shown, but are well-known.

Regulation of the pressure inside the solder ring can be one method for controlling spacing. The pressure outside the parts is usually atmospheric, but could be augmented by placing the assembly inside a pressurized vessel, such as vessel 310, shown in FIG. 3B, and creating a controlled pressure, via pressure device 311 merely changing the ambient air pressure outside the assembly. Vessel 310 is not shown in FIGS. 3A, 3C, 3D for clarity. The final spacing between the two bonded parts is also a function of flatness, solder volume, pad area, and clamping pressure, which are all design choices, depending on the required results and the nature of the assembly.

Keeping the solder contained on the solder pads is desirable. Too much solder can result in some of the solder being forced off of the solder pads and sucked into the middle of the ring if the pressure differential is large enough. Again, this is a design choice. Also note that while two layers are shown, the teachings of this disclosure would allow multiple layers to be sealed, or bonded, together, all using the same sealant, or each layer using a different sealant. Also, the pressure can be different between each layer, if desired.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a seal between a first member and a second member, said method comprising:

situating a solder member between said first member and said second member;

positioning said first and second members in mating relationship so as to create a bounded volume between said members; and creating a pressure differential between the ambient pressure outside said bounded volume and the pressure created within said bounded volume wherein creating said pressure differential comprises at least partially evacuating an area within said bounded volume via at least one aperture formed within at least one of said first and second members.

2. The method of claim 1 further comprises applying heat to said solder member.

3. The method of claim 1 wherein said positioning comprises applying mechanical alignment to at least one of said first and second members.

4. The method of claim 3 wherein said method further comprises removing said mechanical alignment while maintaining said pressure differential.

5. A method of forming a seal between a first member and a second member, said method comprising:

situating a solder member between said first member and said second member;

positioning said first and second members in mating relationship so as to create a bounded volume between said members, wherein said positioning comprises applying mechanical alignment to at least one of said first and second members;

creating a pressure differential between the ambient pressure outside said bounded volume and the pressure created within said bounded volume;

removing said mechanical alignment while maintaining said pressure differential; and eliminating said pressure differential.

6. The method of claim 1 wherein said pressure differential is maintained until a seal is formed between said first and second members.

7. The method of claim 6 wherein said seal is a hermetic seal.

8. The method of claim 1 wherein said situating comprises:

placing a flat surface of said first member against a first surface of said solder member; and placing a flat surface of said second member against a second surface of said solder member.

9. The method of claim 1 further comprises maintaining a pressure differential within said bounded volume after said seal forming method is complete.

10. A method of forming a seal between a first member and a second member, said method comprising:

situating a solder member between said first member and said second member;

positioning said first and second members in mating relationship so as to create a bounded volume between said members; and creating a pressure differential in the range of 82 kPa to 93 kPa between the ambient pressure outside said bounded volume and the pressure created within said bounded volume.

11. The method of claim 1 further comprising inserting a substance within said bounded volume.

12. The method of claim 1 further comprising changing the ambient pressure outside said bounded volume.

* * * * *